(12) United States Patent
Wallis

(10) Patent No.: US 10,770,452 B2
(45) Date of Patent: Sep. 8, 2020

(54) APPARATUS AND METHODS FOR ELECTRICAL OVERSTRESS PROTECTION

(71) Applicant: Skyworks Solutions, Inc., Irvine, CA (US)

(72) Inventor: Leslie Paul Wallis, Ottawa (CA)

(73) Assignee: Skyworks Solutions, Inc., Irvine, CA (US)

( * ) Notice: Subject to any disclaimer, the term of this patent is extended or adjusted under 35 U.S.C. 154(b) by 426 days.

(21) Appl. No.: 15/393,590

(22) Filed: Dec. 29, 2016

(65) Prior Publication Data

US 2017/0194317 A1 Jul. 6, 2017

Related U.S. Application Data

(60) Provisional application No. 62/273,272, filed on Dec. 30, 2015.

(51) Int. Cl.

| | |
|---|---|
| *H02H 9/00* | (2006.01) |
| *H01L 27/02* | (2006.01) |
| *H01L 23/50* | (2006.01) |
| *H01L 23/528* | (2006.01) |
| *H01L 27/12* | (2006.01) |

(Continued)

(52) U.S. Cl.
CPC ......... *H01L 27/0296* (2013.01); *H01L 23/50* (2013.01); *H01L 23/5286* (2013.01); *H01L 24/04* (2013.01); *H01L 24/09* (2013.01); *H01L 24/16* (2013.01); *H01L 24/32* (2013.01); *H01L 24/48* (2013.01); *H01L 24/73* (2013.01); *H01L 27/0255* (2013.01); *H01L 27/0266* (2013.01); *H01L 27/0288* (2013.01); *H01L 27/0292* (2013.01); *H01L 27/1203* (2013.01); *H02H 9/046* (2013.01); *H01L 2224/0401* (2013.01); *H01L 2224/04042* (2013.01); *H01L 2224/09135* (2013.01); *H01L 2224/09165* (2013.01); *H01L 2224/16227* (2013.01); *H01L 2224/32225* (2013.01); *H01L 2224/48227* (2013.01);

(Continued)

(58) Field of Classification Search
USPC .......................................................... 361/56
See application file for complete search history.

(56) References Cited

U.S. PATENT DOCUMENTS

| | | | | |
|---|---|---|---|---|
| 6,064,249 A | * | 5/2000 | Duvvury | ............. H01L 27/0255 327/314 |
| 7,274,546 B2 | | 9/2007 | Gauthier, Jr. et al. | |

(Continued)

*Primary Examiner* — Stephen W Jackson
(74) *Attorney, Agent, or Firm* — Knobbe, Martens, Olson & Bear, LLP

(57) ABSTRACT

Apparatus and methods for electrical overstress (EOS) protection circuits are provided herein. In certain configurations, an EOS protection circuit includes an overstress sensing circuit electrically connected between a pad and a first supply node, an impedance element electrically connected between the pad and a signal node, a controllable clamp electrically connected between the signal node and the first supply node and selectively activatable by the overstress sensing circuit, and an overshoot limiting circuit electrically connected between the signal node and a second supply node. The overstress sensing circuit activates the controllable clamp when an EOS event is detected at the pad. Thus, the EOS protection circuit is arranged to divert charge associated with the EOS event away from the signal node to provide EOS protection.

20 Claims, 10 Drawing Sheets

(51) Int. Cl.
  *H01L 23/00* (2006.01)
  *H02H 9/04* (2006.01)
  *H02H 3/14* (2006.01)
  *H02H 3/16* (2006.01)
(52) U.S. Cl.
  CPC ...... *H01L 2224/73265* (2013.01); *H02H 3/14* (2013.01); *H02H 3/16* (2013.01)

(56) References Cited

U.S. PATENT DOCUMENTS

| | | | | |
|---|---|---|---|---|
| 7,593,204 | B1* | 9/2009 | Iversen | H02H 9/046 361/56 |
| 7,649,722 | B2 | 1/2010 | Thijs et al. | |
| 7,881,029 | B1 | 2/2011 | Li et al. | |
| 10,276,521 | B2* | 4/2019 | Babcock | F21V 23/006 |
| 2002/0153570 | A1* | 10/2002 | Lin | H01L 27/0266 257/355 |
| 2004/0207021 | A1* | 10/2004 | Russ | H01L 27/0262 257/355 |
| 2005/0122644 | A1* | 6/2005 | Ma | H01L 27/0255 361/56 |
| 2005/0269659 | A1 | 12/2005 | Huang | |
| 2007/0070564 | A1* | 3/2007 | Ma | H01L 27/0255 361/56 |
| 2007/0109697 | A1 | 5/2007 | Huh | |
| 2008/0232010 | A1* | 9/2008 | Wang | H01L 27/0255 361/56 |
| 2008/0239599 | A1* | 10/2008 | Yizraeli | H02H 9/046 361/56 |
| 2014/0071566 | A1* | 3/2014 | Parthasarathy | H01L 23/62 361/56 |
| 2014/0085760 | A1* | 3/2014 | Lui | H01L 27/0255 361/91.5 |
| 2016/0013638 | A1* | 1/2016 | Glas | H01L 27/0255 361/56 |
| 2016/0079854 | A1 | 3/2016 | Kinzer et al. | |
| 2016/0172845 | A1* | 6/2016 | Parris | H01L 27/0251 361/56 |
| 2017/0194317 | A1* | 7/2017 | Wallis | H01L 27/0296 |
| 2017/0278840 | A1* | 9/2017 | Robbins | H01L 27/0285 |

* cited by examiner

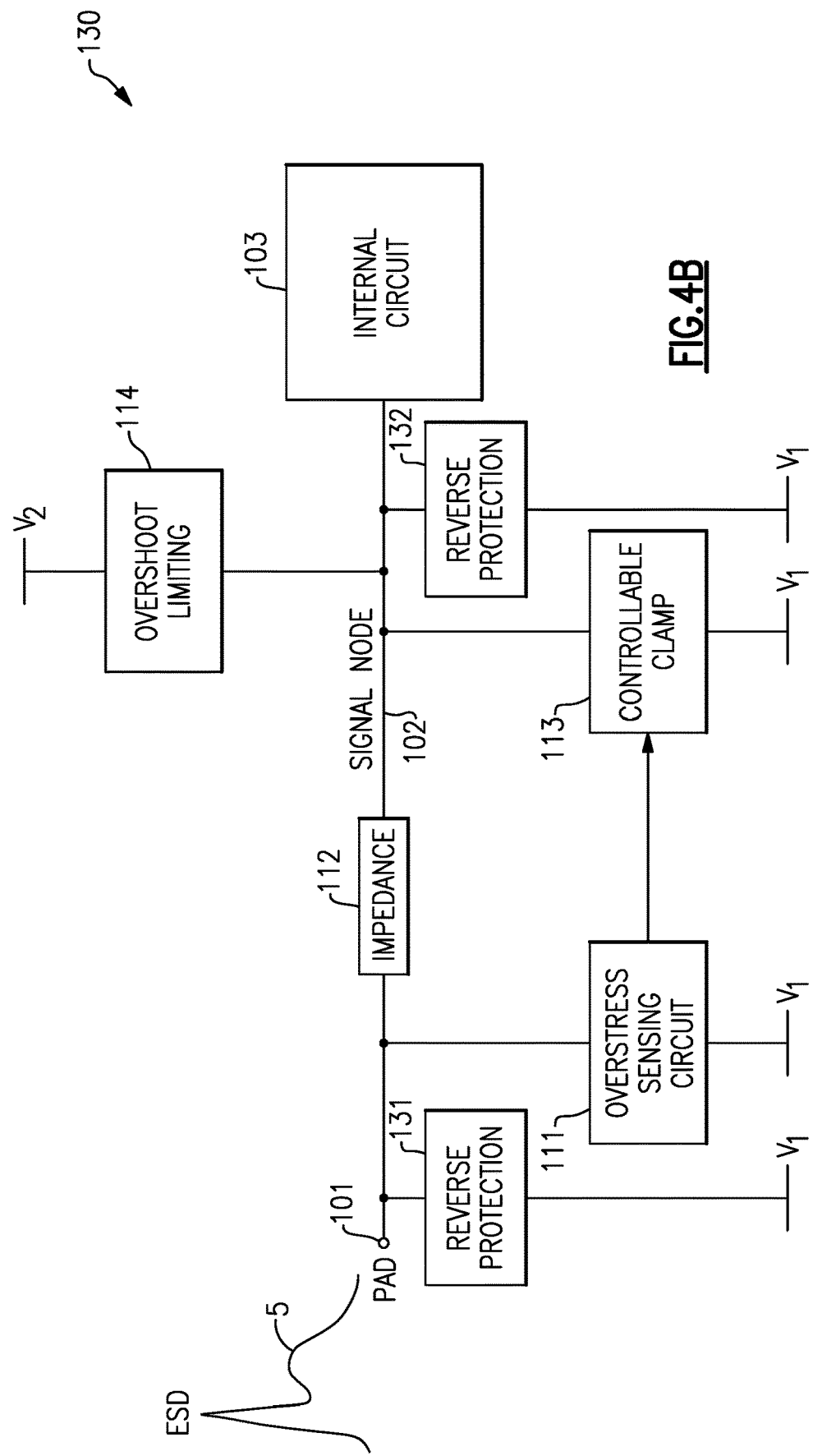

US 10,770,452 B2

APPARATUS AND METHODS FOR ELECTRICAL OVERSTRESS PROTECTION

CROSS-REFERENCE TO RELATED APPLICATIONS

This application claims the benefit of priority under 35 U.S.C. § 119(e) of U.S. Provisional Patent Application No. 62/273,272, filed Dec. 30, 2015 titled "APPARATUS AND METHODS FOR ELECTRICAL OVERSTRESS PROTECTION CIRCUITS," which is herein incorporated by reference in its entirety.

BACKGROUND

Field

Embodiments of the invention relate to electronic systems and in particular, to electrical overstress protection circuits.

Description of the Related Technology

Electrical overstress (EOS) events can arise from a variety of sources, such as external charge sources, supply switching, and/or electromagnetic pulses. EOS events include electrostatic discharge (ESD) events and other transient electrical events associated with high levels of power and/or charge. An EOS event can cause charge build-up in an integrated circuit (IC), leading to high voltage and/or current levels beyond which the IC can reliably tolerate. Absent a protection mechanism, the EOS event can lead to IC damage, such as gate oxide rupture, junction breakdown, and/or metal damage.

An IC's robustness to EOS events can be evaluated in a wide variety of ways. For example, specifications for EOS compliance can be set by various organizations, such as the International Electrotechnical Commission (IEC) and/or Joint Electronic Device Engineering Council (JEDEC). For instance, a human body model (HBM) test can be used to evaluate the IC's performance with respect to ESD events arising from the sudden release of electrostatic charge from a person to an IC. An IC's performance with respect to such specifications can be an important performance metric by which the IC is evaluated.

SUMMARY

In certain embodiments, the present disclosure relates to an integrated circuit with electrical overstress protection. The integrated circuit includes a pad, an internal circuit electrically connected to a signal node, and an overstress protection circuit. The overstress protection circuit includes an overstress sensing circuit electrically connected between the pad and a first supply node, an impedance element electrically connected between the pad and the signal node, a controllable clamp electrically connected between the signal node and the first supply node, and an overshoot limiting circuit electrically connected between the signal node and a second supply node. The overstress sensing circuit is configured to activate the controllable clamp in response to detecting an electrical overstress event at the pad.

In some embodiments, the overstress sensing circuit includes a plurality of diodes and a first field-effect transistor configured to activate when the electrical overstress event generates a flow of current through the plurality of diodes. In a number of embodiments, the controllable clamp includes a second field-effect transistor electrically connected with the first field-effect transistor as a current mirror. In various embodiments, the controllable clamp further includes a clamp diode electrically connected in series with the second field-effect transistor between the signal node and the first supply node.

In several embodiments, the first supply node is a ground rail and the second supply node is a power supply rail.

According to various embodiments, the overshoot limiting circuit includes at least one diode configured to control a trigger voltage of the overshoot limiting circuit. In some embodiments, the overshoot limiting circuit includes two or more diodes electrically connected in series between the signal node and the second supply node.

In various embodiments, the impedance element includes a resistor.

In accordance with a number of embodiments, the integrated circuit further includes a supply clamp electrically connected between the second supply node and the first supply node.

In certain embodiments, the present disclosure relates to an overstress protection circuit for a semiconductor chip. The overstress protection circuit includes an impedance element electrically connected between a pad and a signal node, a controllable clamp electrically connected between the signal node and a first supply node, an overstress sensing circuit electrically connected between the pad and the first supply node, and an overshoot limiting circuit electrically connected between the signal node and a second supply node. The overstress sensing circuit is configured to activate the controllable clamp in response to detecting an electrical overstress event at the pad, and the overstress protection circuit is arranged so as to divert charge associated with the electrical overstress event at the pad away from the signal node to thereby provide overstress protection.

In some embodiments, the overstress sensing circuit includes a plurality of diodes and a first field-effect transistor configured to activate when the electrical overstress event generates a flow of current through the plurality of diodes. In a number of embodiments, the controllable clamp includes a second field-effect transistor having a gate voltage that is controlled based on a gate voltage of the first field-effect transistor. In accordance with some embodiments, the controllable clamp further includes a clamp diode electrically connected in series with the second field-effect transistor between the signal node and the first supply node. According to a number of embodiments, the first and second field-effect transistors are electrically connected as a current mirror.

In several embodiments, the first supply node is a ground rail and the second supply node is a power supply rail.

In various embodiments, the overshoot limiting circuit includes at least one diode configured to control a trigger voltage of the overshoot limiting circuit.

In some embodiments, the impedance element includes a resistor.

In certain embodiments, the present disclosure relates to a method of providing overstress protection. The method includes detecting an electrical overstress event at a pad using an overstress sensing circuit, providing a voltage drop from the pad to a signal node in response to the electrical overstress event using an impedance element, activating a controllable clamp between the signal node and a first supply node in response to detecting the electrical overstress event at the pad using the overstress sensing circuit, and protecting the signal node from overshoot before the controllable clamp is activated using an overshoot limiting circuit.

In several embodiments, activating the controllable clamp includes mirroring a current flowing through the overstress sensing circuit.

In various embodiments, protecting the signal node from overshoot includes forward biasing at least one diode.

BRIEF DESCRIPTION OF THE DRAWINGS

Embodiments of this disclosure will now be described, by way of non-limiting example, with reference to the accompanying drawings.

FIG. 4B is a schematic diagram of an IC interface including an EOS protection circuit according to another embodiment.

DETAILED DESCRIPTION OF EMBODIMENTS

Figure 1:
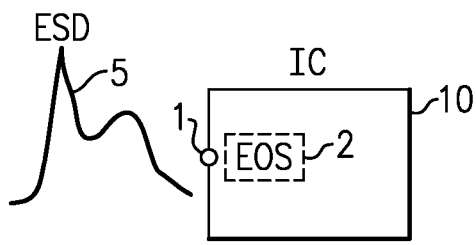
FIG. 1 is a schematic diagram of one example of an integrated circuit that can include one or more electrical overstress (EOS) protection circuits.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

To protect a pin or pad of an integrated circuit (IC) from electrical overstress (EOS) events, the IC can include an EOS protection circuit connected between the pad and ground. To prevent the EOS protection circuit from interfering with normal operation of the IC, it is desirable for the EOS protection circuit to be turned off and non-conducting when normal operating conditions or voltage levels are present at the pad, and to turn on and conduct to provide overstress protection in response to an EOS event occurring.

Certain EOS protection circuits are implemented using a number of series-connected diodes between a pad and ground. For example, an EOS protection circuit can include a number of diodes in series to provide a trigger voltage sufficiently above normal operating voltage levels of the pad. To prevent the EOS protection circuit from accidentally triggering and conducting in the presence of normal operating voltage levels, the number of series-connected diodes can be selected such that the resulting trigger voltage is safely above the maximum operating voltage of the pad.

However, such a protection scheme can limit and/or constrain EOS protection. For example, the trigger voltage of an EOS protection circuit implemented with multiple diodes in series can be based on a sum of the forward voltages of the diodes. For instance, the trigger voltage of an EOS protection circuit with about n identical series-connected diodes can be about n*Vf, where Vf is the forward voltage of each diode.

A diode's forward voltage can reduce with temperature. To prevent unintended activation at high temperatures by normal signaling, the EOS protection circuit should be implemented with a minimum number of diodes sufficient to avoid conduction under normal operating conditions. However, when a sufficient number of diodes are included to accommodate both the maximum pad voltage during normal operation, a desired voltage margin, process variation, and the maximum operating temperature of the IC, EOS protection is reduced at normal temperatures and conditions.

For example, when the EOS protection circuit is implemented in this manner, the EOS protection circuit's trigger voltage can be relatively high at normal operating temperatures, thereby resulting in an increase in peak voltage levels under ESD conditions and a corresponding degradation in overstress protection.

Accordingly, providing protection using only series-connected diodes to ground may be insufficient, since too many series-diodes may need to be included to avoid conduction under normal signaling conditions across process and/or temperature variations.

In other implementations, a diode is electrically connected between the pad and a power high supply voltage to provide EOS protection. However, during an EOS event, overstress current can flow into the power high supply voltage. Although a clamp circuit can be used to limit a voltage increase of the power high supply rail during an EOS event, the clamp circuit can decrease power performance by generating leakage current, which can be unacceptable in certain low power applications.

Apparatus and methods for EOS protection circuits are provided herein. In certain configurations, an EOS protection circuit includes an overstress sensing circuit electrically connected between a pad and a first supply node, an impedance element electrically connected between the pad and a signal node, a controllable clamp electrically connected between the signal node and the first supply node and selectively activatable by the overstress sensing circuit, and an overshoot limiting circuit electrically connected between the signal node and a second supply node. The overstress sensing circuit activates the controllable clamp when an EOS event is detected at the pad. Thus, the EOS protection circuit is arranged to divert charge associated with the EOS event away from the signal node to provide EOS protection.

In certain implementations, the overstress sensing circuit includes a plurality of series-connected diodes and a first field-effect transistor (FET), such as a first metal-oxide-semiconductor (MOS) transistor. Additionally, the controllable clamp includes a second FET, such as a second MOS transistor, having a gate voltage that is controlled based on a gate voltage of the first FET. For example, the first and second FETs can be implemented as a current mirror. Under EOS conditions at the pad, current flows through the overstress sensing circuit's series-connected diodes, thereby turning on the first and second FETs and activating the controllable clamp.

Additionally, the inclusion of the impedance element between the pad and the signal node results in the voltage of the signal node being less than that of the pad in response to a voltage increase at the pad. Additionally, the overshoot limiting circuit holds the voltage at the signal node to a relatively low value until the controllable clamp is activated. Implementing the EOS protection circuit in this manner reduces the peak current injected into the second supply node and reduces voltage overshoot at the signal node. The reduction in peak current leads to a smaller supply clamp (for instance, a more compact circuit layout) between the first and second supply nodes and a corresponding decrease in the IC's static power dissipation.

Accordingly, the teachings herein can be used to provide enhanced EOS protection. Additionally, protecting an IC's pads using one or more of the EOS protection circuits described herein can lead to a smaller and/or lower leakage supply clamp.

In certain configurations, the first supply node corresponds to ground. In such configurations, the EOS protection circuit advantageously shunts charge of the EOS event to a node exhibiting very low impedance and/or enhanced thermal dissipation relative to other supply nodes.

FIG. 1 is a schematic diagram of an IC 10. As shown in FIG. 1, the IC 10 can include one or more pins or pads 1 that can be exposed to EOS conditions, such as an ESD event 5. The IC 10 can include at least one EOS protection circuit 2 implemented in accordance with the teachings herein.

Figure 2:
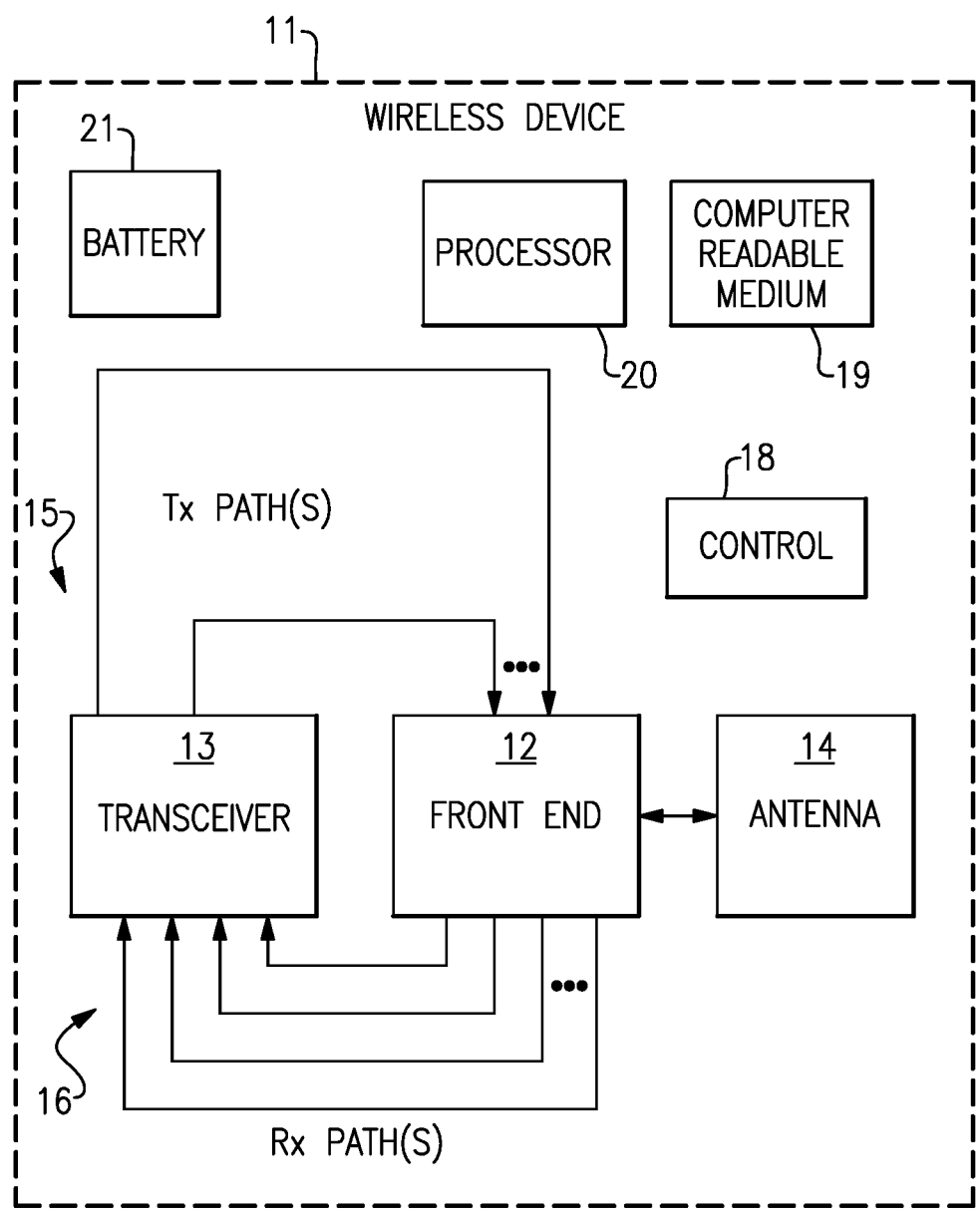
FIG. 2 is a schematic diagram of an example wireless device that can include one or more EOS protection circuits.

FIG. 2 is a schematic diagram of an example wireless or mobile device 11 that can include one or more of the ICs of FIG. 1. The wireless device 11 can include EOS protection circuits implementing one or more features of the present disclosure. For example, wireless device 11 can include multiple semiconductor chips or ICs, and one or more of the ICs can include EOS protection circuits implemented in accordance with the teachings herein.

The example wireless device 11 depicted in FIG. 2 can represent a multi-band and/or multi-mode device such as a multi-band/multi-mode mobile phone. In certain embodiments, the wireless device 11 can include a front end 12, a transceiver 13, an antenna 14, a control component 18, a computer readable medium or memory 19, a processor 20, and a battery 21.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. Although FIG. 2 illustrates a configuration using two transmission paths 15, the wireless device 11 can be adapted to include more or fewer transmission paths 15.

In FIG. 2, one or more detected signals from the antenna 14 are depicted as being provided to the transceiver 13 via one or more receiving paths 16. In the example shown, different receiving paths 16 can represent paths associated with different bands. Although FIG. 2 illustrates a configuration using four receiving paths 16, the wireless device 11 can be adapted to include more or fewer receiving paths 16.

To facilitate switching between receive and transmit paths, the front end 12 can be configured to electrically connect the antenna 14 to a selected transmit or receive path. Thus, the front end 12 can provide a number of switching functionalities associated with an operation of the wireless device 11. In certain embodiments, the front end 12 can provide switching between different bands, switching between different power modes, switching between transmission and receiving modes, or some combination thereof. The front end 12 can also be configured to provide additional functionality, including filtering, amplification, and/or duplexing of signals.

FIG. 2 shows that in certain embodiments, a control component 18 can be provided for controlling various control functionalities associated with operations of the wireless device 11.

In certain embodiments, a processor 20 can be configured to facilitate implementation of various processes of the wireless device 11. For example, the processor 20 can operate using computer program instructions stored in a computer-readable memory 19 that can direct the processor 20 to operate in a particular manner.

The battery 21 can be any suitable battery for use in the wireless device 11, including, for example, a lithium-ion battery.

Figure 3A:
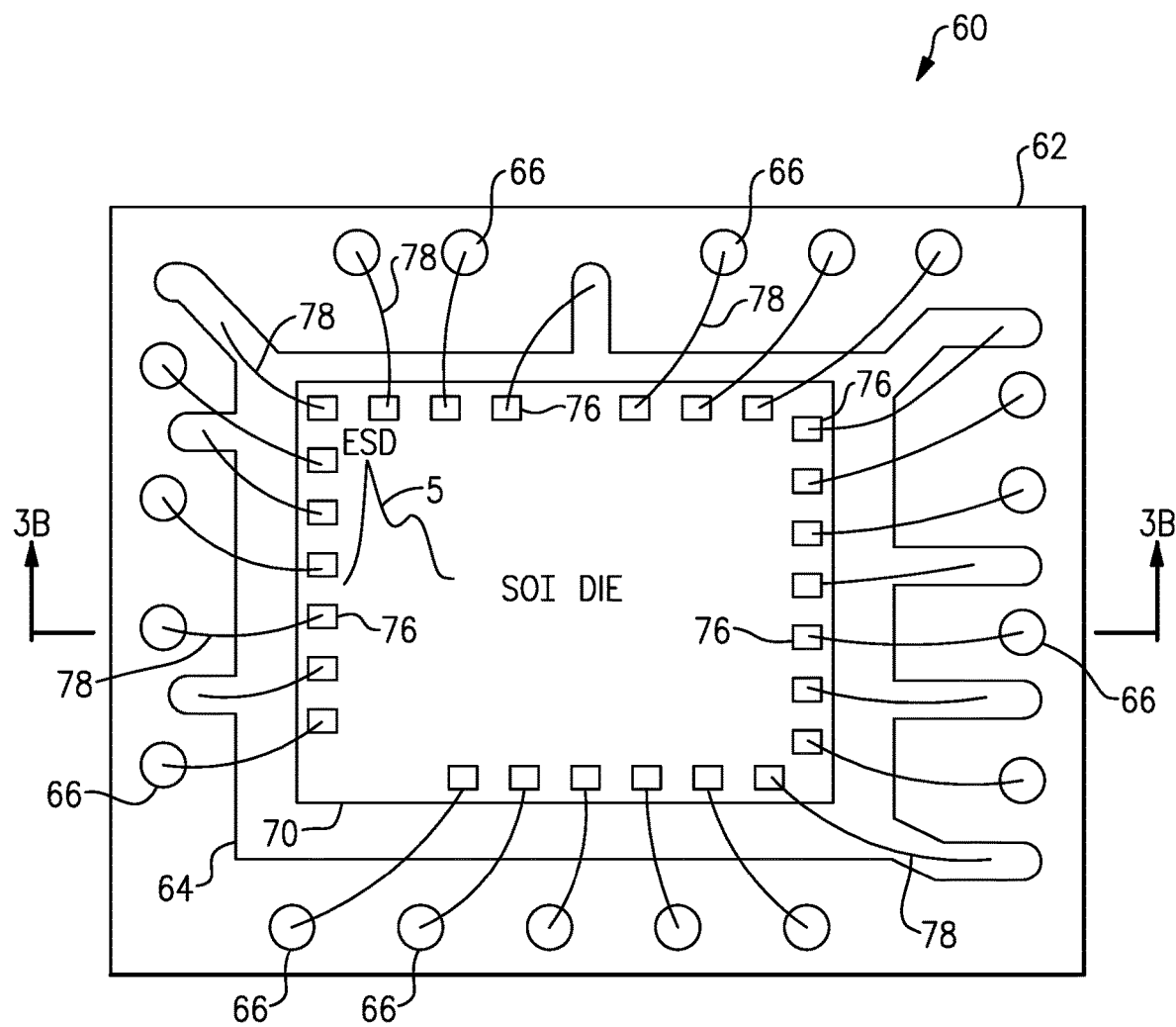
FIG. 3A is a schematic diagram of one example of a module that can include one or more EOS protection circuits.
Figure 3B:
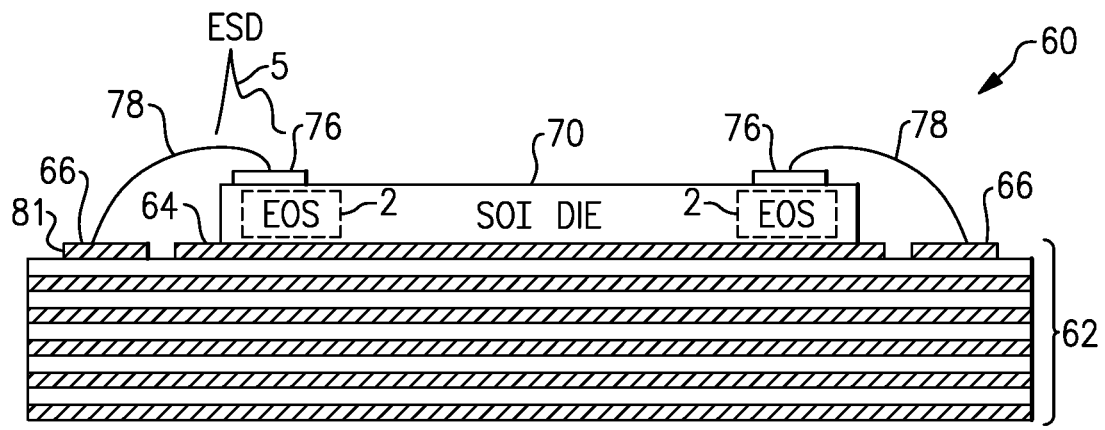
FIG. 3B is a cross section of the module of FIG. 3B taken along the lines 3B-3B.

FIG. 3A is a schematic diagram of one example of a module 60 that can include one or more EOS protection circuits. FIG. 3B is a cross section of the module 60 of FIG. 3B taken along the lines 3B-3B. The module 60 includes a module substrate or laminate 62, a silicon on insulator (SOI) die 70, and bond wires 78. In certain implementations, the module 60 corresponds to a front end module.

The module substrate 62 includes a die attach pad 64 and bond pads 66. As shown in FIG. 3A, the SOI die 70 has been attached to the die attach pad 64 of the module substrate 62. As depicted in FIG. 3B, the module substrate 62 can include a plurality of conductive and non-conductive layers laminated together, and the die attach pad 64 and the bond pads 66 can be formed from a conductive layer 81 disposed on the surface of the module substrate used to attach the SOI die 70.

The SOI die 70 includes pads 76 that can be exposed to EOS events, such as the ESD event 5. At least a portion of the pads 76 of the SOI die 70 can include corresponding EOS protection circuits 2 implemented in accordance with the teachings herein.

Figure 3C:
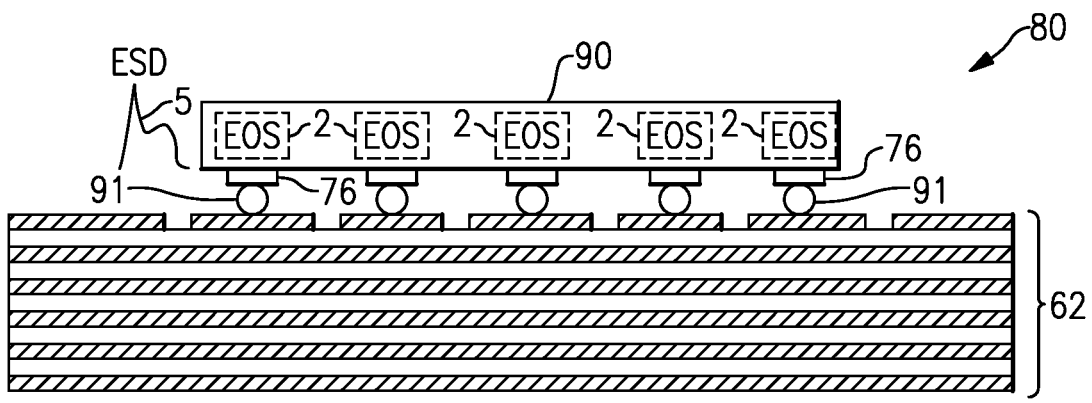
FIG. 3C is a cross section of a module according to another embodiment.

FIG. 3C is a cross section of a module 80 according to another embodiment.

The module 80 of FIG. 3C is similar to the module 60 of FIGS. 3A-3B, except that the module 80 is implemented using a flip-chip configuration. For example, rather than using wire bonds to electrically connect the SOI die 90 to the module substrate 62, the SOI die 90 of FIG. 3C has been flipped upside down and attached to the module substrate 62 using solder bumps 91. At least a portion of the pads 76 of the SOI die 70 can include EOS protection circuits 2 implemented in accordance with the teachings herein.

Accordingly, in certain implementations described herein, EOS protection circuits are included in a die implemented using a flip-chip arrangement.

Although FIGS. 3A-3C illustrate example modules including an SOI die that includes one or more EOS protection circuits, the teachings herein are applicable to other configurations of modules and/or dies.

Figure 4A:
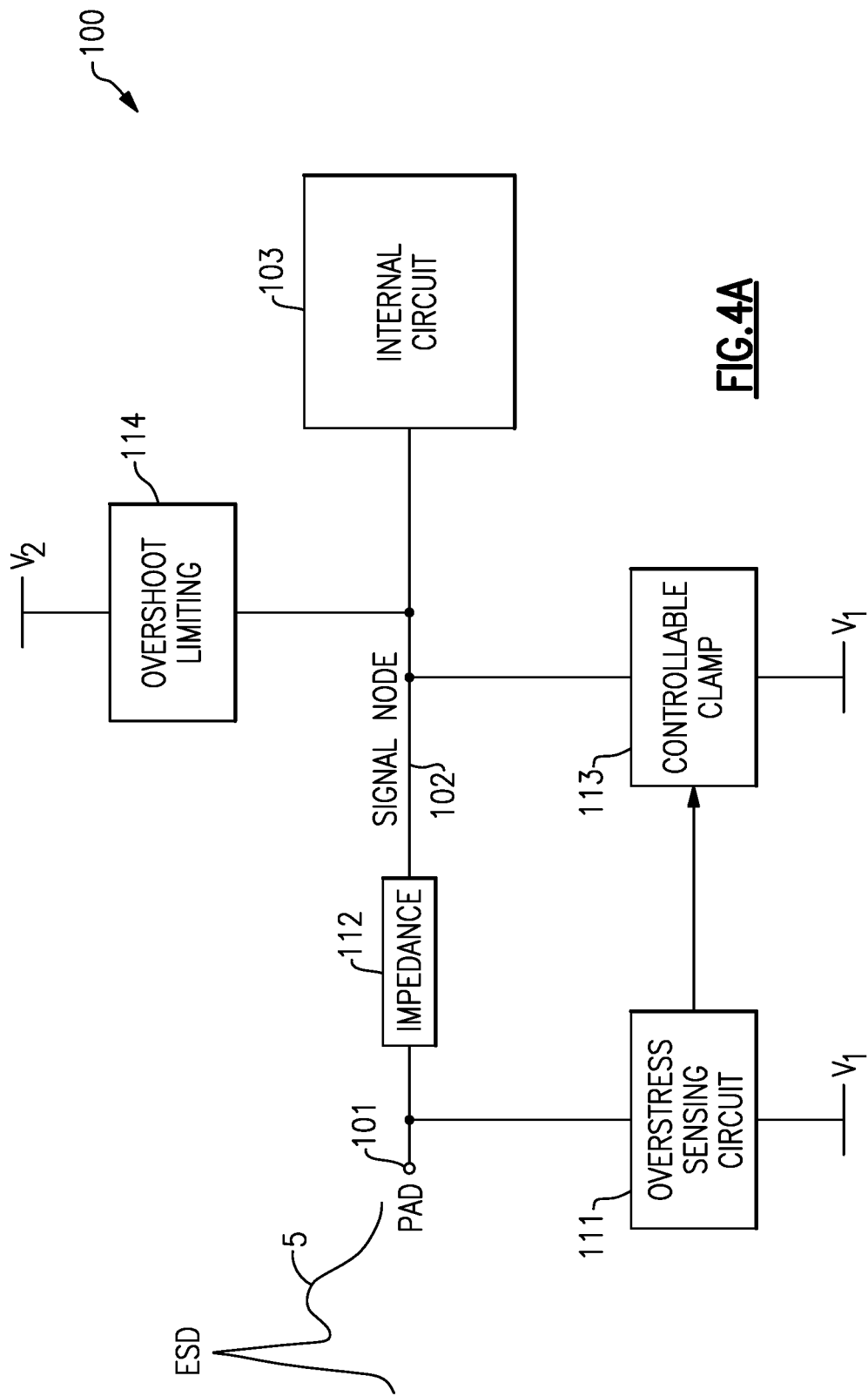
FIG. 4A is a schematic diagram of an integrated circuit (IC) interface including an EOS protection circuit according to one embodiment.

FIG. 4A is a schematic diagram of an IC interface 100 including an EOS protection circuit according to one embodiment. The IC interface 100 includes a pad 101, an internal circuit 103, and an EOS protection circuit including an overstress sensing circuit 111, an impedance element 112, a controllable clamp 113, and an overshoot protection or limiting circuit 114.

The IC interface 100 can undesirably receive EOS events, such as the ESD event 5 at the pad 101. Absent a protection mechanism, the EOS event can lead to IC damage, such as gate oxide rupture, junction breakdown, and/or metal damage. For example, the internal circuit 103 can include sensitive transistors and/or structures that can be damaged absent an EOS protection mechanism.

As shown in FIG. 4A, the overstress sensing circuit 111 is electrically connected between the pad 101 and a first supply node or rail $V_1$. Additionally, the impedance element 112 is electrically connected between the pad 101 and a signal node 102. Furthermore, the controllable clamp 113 is electrically connected between the signal node 102 and the first supply node $V_1$, and is selectively activatable by the overstress sensing circuit 111. Additionally, the overshoot limiting circuit 114 is electrically connected between the signal node 102 and a second supply node or rail $V_2$.

The overstress sensing circuit 111 is electrically connected to the pad 101, and detects when an EOS event, such as ESD event 5, is received at the pad 101. When the EOS event is detected, the overstress sensing circuit 111 activates the controllable clamp 113 to provide a low impedance path between the signal node 102 and the first supply node $V_1$. Thus, the EOS protection circuit is arranged to divert charge associated with the EOS event away from the signal node 102 to provide EOS protection.

The overstress sensing circuit 111 and the controllable clamp 113 can be implemented in a wide variety of ways. In one embodiment, the overstress sensing circuit 111 includes a plurality of series-connected diodes and a first FET. Additionally, the controllable clamp 113 includes a second FET having a gate voltage controlled based on a gate voltage of the first FET. When an EOS event is received at the pad 101, current flows through the overstress sensing circuit's series-connected diodes, thereby activating the first and second FETs.

With continuing reference to FIG. 4A, the impedance element 112 is electrically connected between the pad 101 and the signal node 102. Thus, when an EOS event increases the voltage of the pad 101 relative to the first supply node $V_1$, the impedance element 112 provides a voltage drop that results in the voltage of the signal node 102 being less than that of the pad 101. The illustrated EOS protection circuit further includes the overshoot limiting circuit 114, which transitions from high to low impedance when the voltage of the signal node 102 increases above the voltage of the second supply node $V_2$ by a trigger voltage of the overshoot limiting circuit 114.

Including the impedance element 112 and the overshoot limiting circuit 114 maintains the voltage level of the signal node 102 relatively low when an EOS event is present. In particular, the overshoot limiting circuit 114 holds or limits the voltage at the signal node 102 to a relatively low level until the overstress sensing circuit 111 activates the controllable clamp 113. Additionally, the impedance element 112 provides a voltage drop that allows the overshoot limiting circuit 114 to maintain the signal node's voltage to a relatively low voltage level even when the EOS event causes the voltage of the pad 101 to increase to a relatively high voltage level.

Accordingly, the illustrated configuration of the impedance element 112 and the overshoot limiting circuit 114 aids in maintaining the signal node 102 at a relatively low voltage level. Furthermore, the inclusion of the impedance element 112 reduces the amount of charge that is injected into the second supply node $V_2$ via the overshoot limiting circuit 114 relative to a configuration in which the signal node 102 is directly connected to the pad 101. Accordingly, the illustrated configuration exhibits a relatively small amount of peak current injection into the second supply node $V_2$ and reduces voltage overshoot of the signal node 102 during an EOS event. In certain implementations, the reduction in peak current leads to a smaller supply clamp (for example, the supply clamp 157 of FIG. 4C) between the first and second supply nodes $V_1$, $V_2$ and a corresponding decrease in the IC's static power dissipation.

Additional details of the IC interface 100 can be as described earlier.

FIG. 4B is a schematic diagram of an IC interface 130 including an EOS protection circuit according to another embodiment. The IC interface 130 includes a pad 101, an internal circuit 103, and an EOS protection circuit including an overstress sensing circuit 111, an impedance element 112, a controllable clamp 113, an overshoot limiting circuit 114, a first reverse protection circuit 131, and a second reverse protection circuit 132.

The IC interface 130 of FIG. 4B is similar to the IC interface 100 of FIG. 4A, except that the IC interface 130 further includes the first reverse protection circuit 131 and the second reverse protection circuit 132. In certain implementations, the overstress sensing circuit 111 is implemented to activate the controllable clamp 113 in response to detecting a positive polarity EOS event that increases the voltage of the pad 101 relative to the first supply node $V_1$.

In the illustrated embodiment, the first reverse protection circuit 131 and the second reverse protection circuit 132 have been included to protect the IC interface 130 against a negative EOS event that decreases the voltage of the pad 101 relative to the first supply node $V_1$. The first reverse protection circuit 131 is electrically connected between the pad 101 and the first supply node $V_1$, and transitions from high to low impedance when the voltage of the pad 101 falls below the voltage of the first supply node $V_1$ by a trigger voltage of the first reverse protection circuit 131. Additionally, the second reverse protection circuit 132 is electrically connected between the signal node 102 and the first supply node $V_1$, and transitions from high to low impedance when the voltage of the signal node 102 falls below the voltage of the first supply node $V_1$ by a trigger voltage of the second reverse protection circuit 132.

Although the illustrated IC interface 130 of FIG. 4B includes two reverse protection circuits, more or fewer reverse protection circuits can be included. In one embodiment, the first reverse protection circuit 131 is included and the second reverse protection circuit 132 is omitted. In another embodiment, the first reverse protection circuit 131 is omitted and the second reverse protection circuit 132 is included.

Additional details of the IC interface 130 can be as described earlier.

Figure 4C:
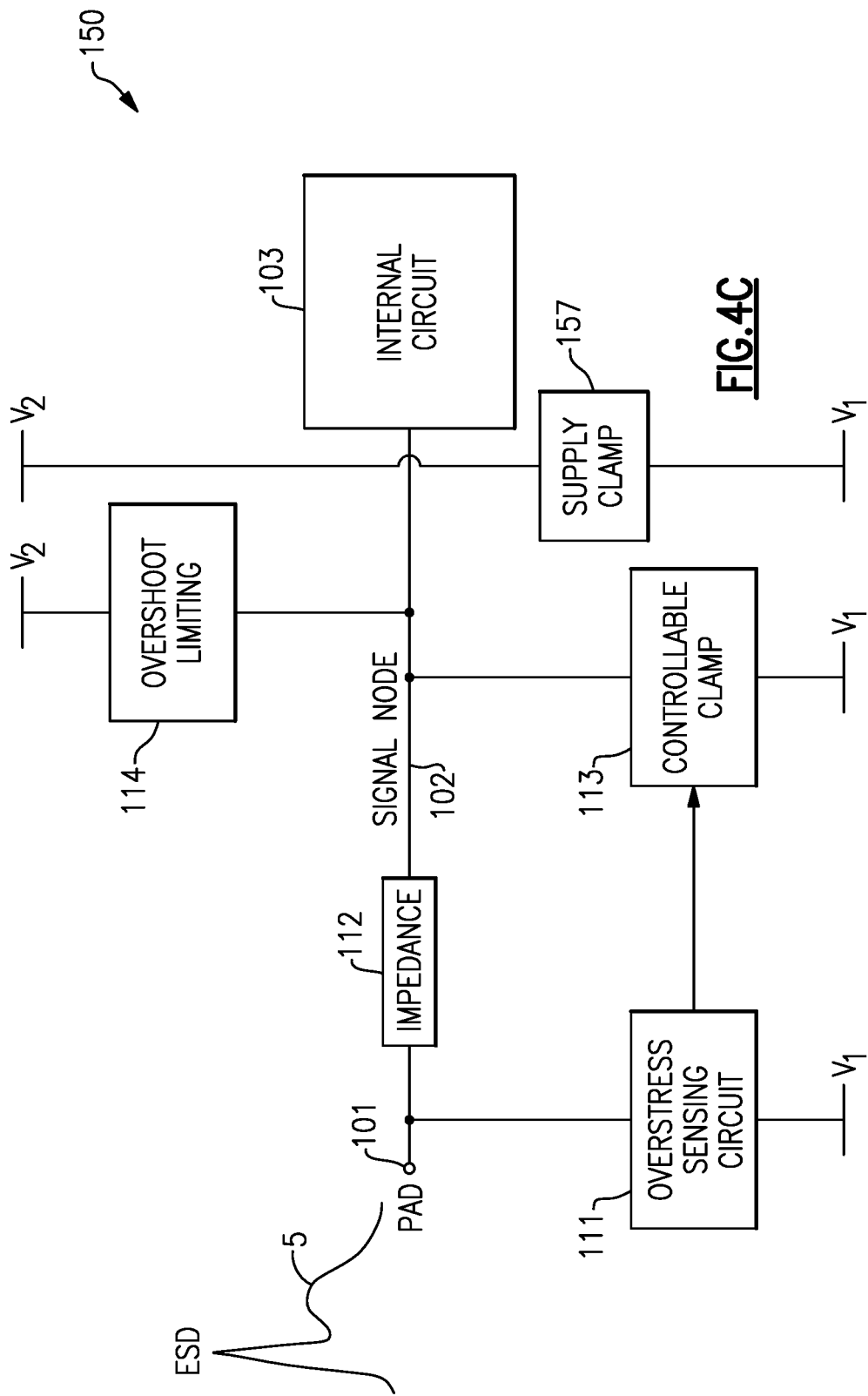
FIG. 4C is a schematic diagram of an IC interface including an EOS protection circuit according to another embodiment.

FIG. 4C is a schematic diagram of an IC interface 150 including an EOS protection circuit according to another embodiment. The IC interface 150 includes a pad 101, an internal circuit 103, and an EOS protection circuit including an overstress sensing circuit 111, an impedance element 112, a controllable clamp 113, an overshoot limiting circuit 114, and a supply clamp 157.

The IC interface 150 of FIG. 4C is similar to the IC interface 100 of FIG. 4A, except that the IC interface 150 further includes the supply clamp 157. In certain implementations, the supply clamp 157 is included to help limit a voltage difference between the second supply node $V_2$ and the first supply node $V_1$ during an overstress event.

Additional details of the IC interface 150 can be as described earlier.

Figure 5:
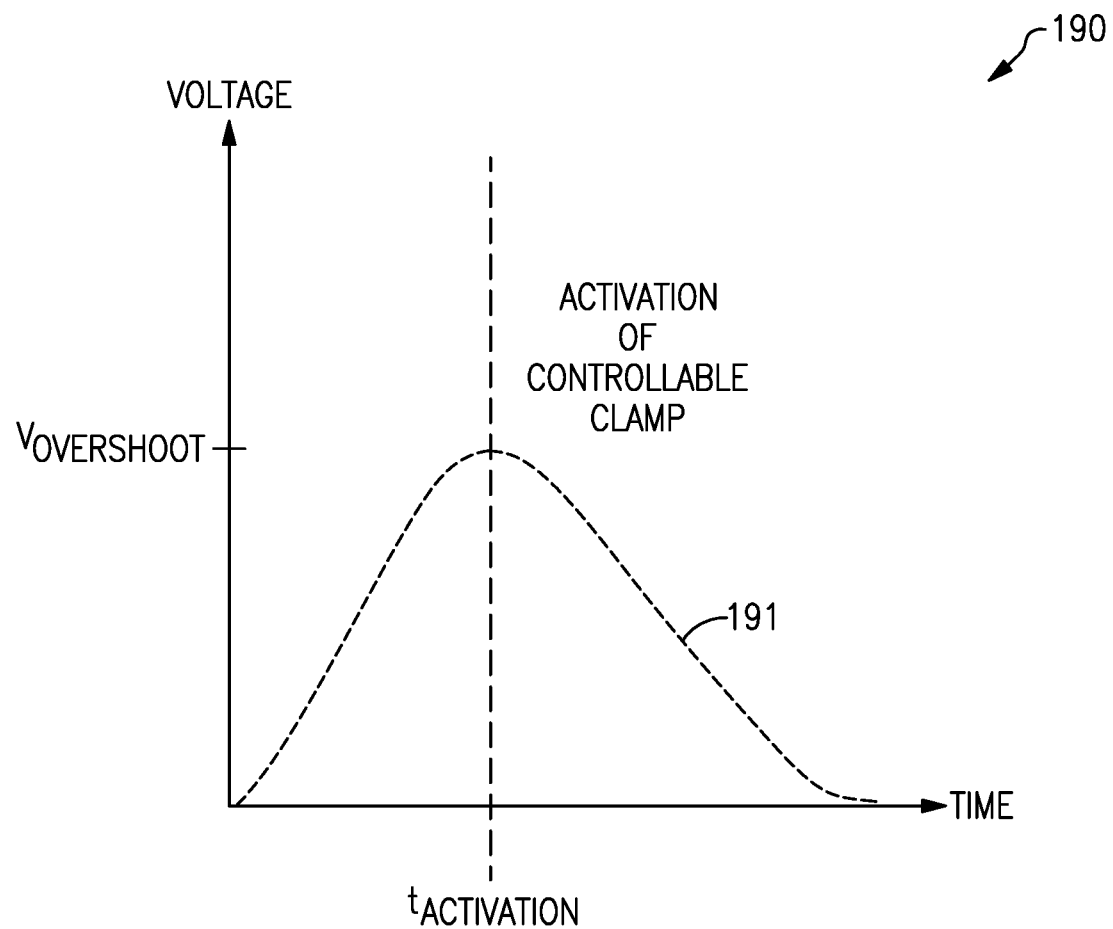
FIG. 5 is one example of a graph of voltage versus time for the EOS protection circuit of FIG. 4A.

FIG. 5 is one example of a graph 190 of voltage versus time for the EOS protection circuit of FIG. 4A. The graph 190 includes a plot 191 of the voltage of the signal node 102 of FIG. 4A versus time.

The graph 190 begins at time zero, in which an EOS event is received at the pad 101. The graph 190 has been annotated to show an activation time $t_{ACTIVATION}$, corresponding to a time at which the controllable clamp 113 is activated or turned on by the overstress sensing circuit 111. The activation time $t_{ACTIVATION}$ can be associated with a delay in detecting the EOS event and in providing a control voltage and/or current of sufficient magnitude to activate the controllable clamp 113.

As shown in FIG. 5, the voltage of the signal node 102 can increase during a period of time in which the controllable clamp 113 is not activated. By including the impedance element 112 and the overshoot limiting circuit 114, the voltage overshoot $V_{OVERSHOOT}$ of signal node 102 can be decreased. Reducing voltage overshoot can provide enhanced protection to the internal circuit 103 and/or reduce charge injection to the second supply node $V_2$ via the overshoot limiting circuit 114.

Although FIG. 5 illustrates one example of a graph of voltage versus time for the EOS protection circuit of FIG. 4A, other results are possible. For example, simulated and/or measured results can vary based on implementation and/or application.

Figure 6A:
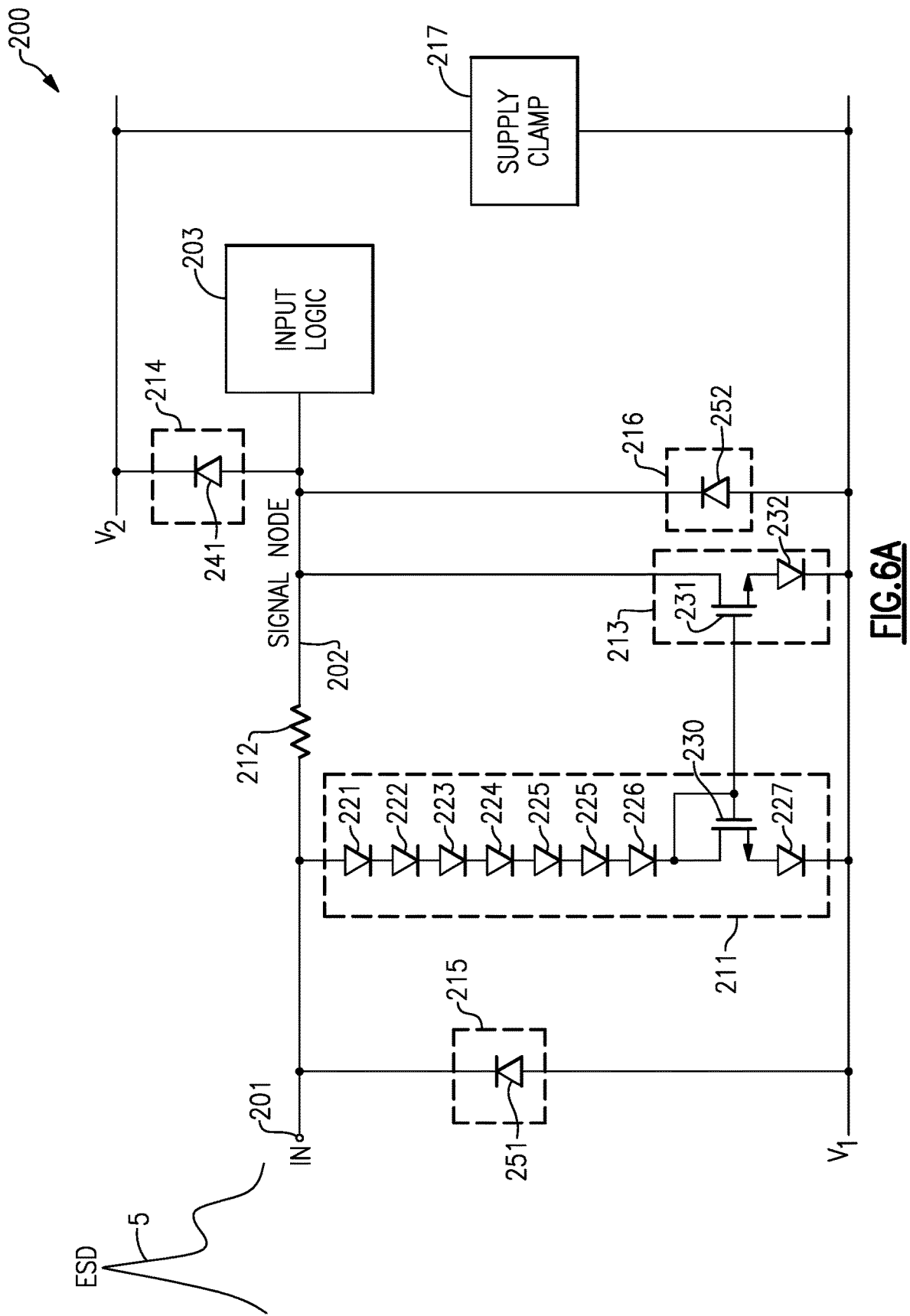
FIG. 6A is a schematic diagram of an IC interface including an EOS protection circuit according to another embodiment.

FIG. 6A is a schematic diagram of an IC interface 200 including an EOS protection circuit according to another embodiment. The IC interface 200 includes an input pad 201, an input logic circuit 203, and an EOS protection circuit including an overstress sensing circuit 211, a resistor 212, a controllable clamp 213, an overshoot limiting circuit 214, a first reverse protection circuit 215, a second reverse protection circuit 216, and a supply clamp 217.

The IC interface 200 can receive EOS events such as the ESD event 5 at the input pad 201. Absent a protection mechanism, the EOS event can lead to IC damage, such as damage to the input logic circuit 203 that is electrically connected to the signal node 202.

The illustrated EOS protection circuit provides bidirectional EOS protection against both positive polarity EOS events that increase the voltage of the input pad 201 relative to the first supply node $V_1$ and against negative polarity EOS events that decrease the voltage of the input pad 201 relative to the first supply node $V_1$.

As shown in FIG. 6A, the overstress sensing circuit 211 is electrically connected between the input pad 201 and a first supply node $V_1$. The overstress sensing circuit 211 includes first to seventh diodes 221-227, respectively, and a first n-type metal oxide semiconductor (NMOS) transistor 230. As shown in FIG. 6A, the first to sixth diodes 221-226 are electrically connected in series from anode to cathode between the input pad 201 and a drain of the first NMOS transistor 230. Additionally, the seventh diode 227 includes an anode electrically connected to a source of the first NMOS transistor 230 and a cathode electrically connected to the first supply node $V_1$. The first NMOS transistor 230 is diode-connected, and includes a gate and drain electrically connected to one another.

The illustrated controllable clamp 213 includes a second NMOS transistor 231 and a clamp diode 232. The second NMOS transistor 231 includes a drain electrically connected to the signal node 202, and a source electrically connected to the first supply node $V_1$ via the clamp diode 232. Including the clamp diode 232 in the controllable clamp 213 can aid in reducing the clamp's leakage current when normal signaling conditions are present and the controllable clamp 213 is turned off. As shown in FIG. 6A, the gate of the second NMOS transistor 231 of the controllable clamp 213 is electrically connected to the gate of the first NMOS transistor 230 of the overstress sensing circuit 211.

In the illustrated embodiment, the first NMOS transistor 230 of the overstress sensing circuit 211 and the second NMOS transistor 231 of the controllable clamp 213 are connected as a current mirror. Although a specific implementation of overstress sensing circuit and controllable clamp are shown, the teachings herein are applicable to a wide variety of overstress sensing circuits and controllable clamps.

The overstress sensing circuit 211 activates the controllable clamp 213 when a positive polarity EOS event is detected at the input pad 201. For example, when the voltage at the input pad 201 is sufficiently high, a current can flow through the first to seventh diodes 221-227 and the first NMOS transistor 230, thereby controlling the gate voltage of the first NMOS transistor 230 to a sufficient voltage to turn on the second NMOS transistor 231. The activation voltage of the overstress sensing circuit 211 can be based on a forward voltage of the diodes 221-227 and a threshold voltage of the first NMOS transistor 230.

As shown in FIG. 6A, the resistor 212 is electrically connected between the input pad 201 and the signal node 202. Additionally, the overshoot limiting circuit 214 is electrically connected between the signal node 202 and the second supply node $V_2$. In the illustrated configuration, the overshoot limiting circuit 214 includes an overshoot limiting diode 241 including an anode electrically connected to the signal node 202 and a cathode electrically connected to the second supply node $V_2$. Implementing the overshoot limiting circuit 214 in this manner can provide the overshoot limiting circuit 214 with a relatively low trigger voltage that is about equal to a forward voltage of the overshoot limiting diode 241. However, other configurations are possible, such as implementations selected based on signaling levels and/or processing constraints.

When an EOS event increases the voltage of the input pad 201 relative to the first supply node $V_1$, the resistor 212 provides a voltage drop that results in the voltage of the signal node 202 being less than that of the input pad 201. Including the resistor 212 and the overshoot limiting circuit 214 maintains the voltage level of the signal node 202 relatively low when an EOS event is present. In particular, the overshoot limiting circuit 214 holds the voltage at the signal node 202 to a relatively low level until the overstress sensing circuit 211 activates the controllable clamp 213. Additionally, the resistor 212 provides a voltage drop that allows the overshoot limiting circuit 214 to maintain the signal node's voltage to a relatively low voltage level even when the EOS event causes the voltage of the input pad 201 to increase to a relatively high voltage level.

Furthermore, the inclusion of the resistor 212 reduces the amount of charge that is injected into the second supply node $V_2$ via the overshoot limiting circuit 214 relative to a configuration in which the signal node 202 is directly connected to the input pad 201. Accordingly, the illustrated configuration exhibits a relatively small amount of peak current injection into the second supply node $V_2$ and reduces voltage overshoot of the signal node 202 during an EOS event. The reduction in peak current leads to a reduction in a size of the supply clamp 217 and a corresponding decrease in leakage current.

In the illustrated embodiment, the resistor 212 is an explicit resistor (for instance, a thin-film resistor), and corresponds to more than mere parasitic resistance.

The illustrated EOS protection circuit further includes the first reverse protection circuit 215 and the second reverse protection circuit 216, which aid in providing protection against negative polarity EOS events that decrease the voltage of the input pad 201 relative to the first supply node $V_1$. In the illustrated embodiment, the first reverse protection circuit 215 includes a diode 251 including an anode electrically connected to the first supply node $V_1$ and a cathode electrically connected to the input pad 201. Additionally, the second reverse protection circuit 216 includes a diode 252 including an anode electrically connected to the first supply node $V_1$ and a cathode electrically connected to the signal node 202. However, other configurations are possible.

Additional details of the IC interface 200 can be as described earlier.

Figure 6B:
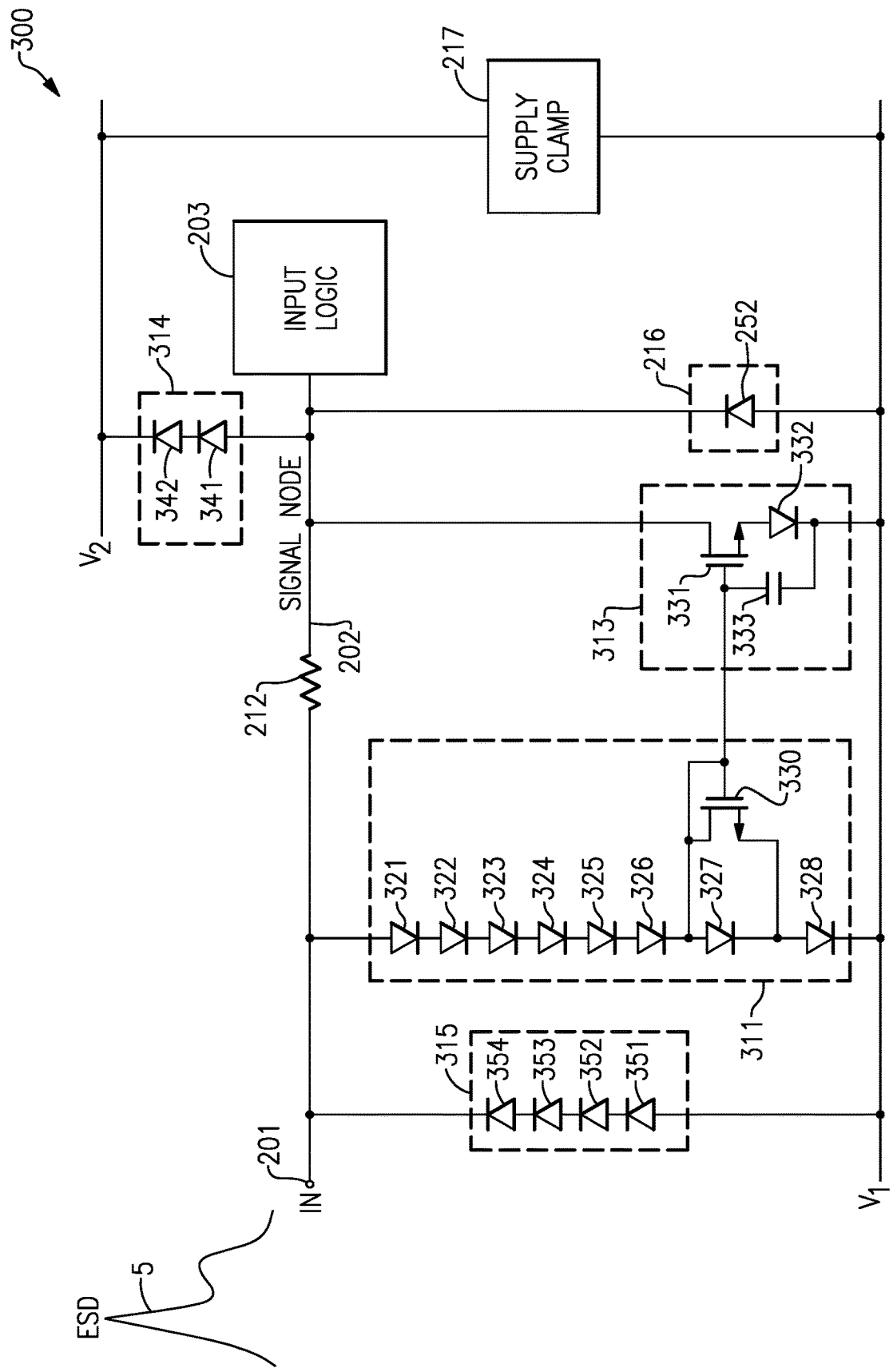
FIG. 6B is a schematic diagram of an IC interface including an EOS protection circuit according to another embodiment.

FIG. 6B is a schematic diagram of an IC interface 300 including an EOS protection circuit according to another embodiment. The IC interface 300 includes an input pad 201, an input logic circuit 203, and an EOS protection circuit including an overstress sensing circuit 311, a resistor 212, a controllable clamp 313, an overshoot limiting circuit 314, a first reverse protection circuit 315, a second reverse protection circuit 216, and a supply clamp 217.

The EOS protection circuit of FIG. 6B is similar to the EOS protection circuit of FIG. 6A, except that the EOS protection circuit of FIG. 6B includes different implementations of certain circuits.

For example, in the embodiment illustrated in FIG. 6B, the overstress sensing circuit 311 includes first to eight diodes 321-328, respectively, and a first NMOS transistor 330. The first to eight diodes 321-328 are electrically connected in series from anode to cathode between the input pad 201 and the first supply node $V_1$, and control a voltage at which the overstress sensing circuit 311 detects overstress. Additionally, the first NMOS transistor includes a drain and gate electrically connected to the anode of the seventh diode 327, and a source electrically connected to a cathode of the seventh diode 327.

The illustrated controllable clamp 313 of FIG. 6B includes the second NMOS transistor 331 and clamp diode 332, which can be similar to the second NMOS transistor 231 and clamp diode 232 described earlier with respect to FIG. 6A. The controllable clamp 313 of FIG. 6B further includes the capacitor 333, which is electrically connected between the gate of the second NMOS transistor 331 and the first supply node $V_1$. The capacitor 333 can aid in stabilizing a control voltage used to activate the controllable clamp 313, thereby helping to prevent unintended activation.

The illustrated overshoot limiting circuit 314 of FIG. 6B includes a first diode 341 and a second diode 342 electrically connected in series from anode to cathode between the signal node 202 and the second supply node $V_2$. Although the overshoot limiting circuit 314 includes two diodes in series, more or fewer diodes can be included. Moreover, other implementations of overshoot limiting circuits are possible, such as implementations selected based on signaling levels and/or processing constraints.

The illustrated first reverse protection circuit 315 includes first to fourth diodes 351-354 electrically connected in series from anode to cathode between the first supply node $V_1$ and the input pad 201. However, other configurations are possible, including, but not limited to, implementations with more or fewer diodes in series.

Additional details of the IC interface 300 can be as described earlier.

Figure 7A:
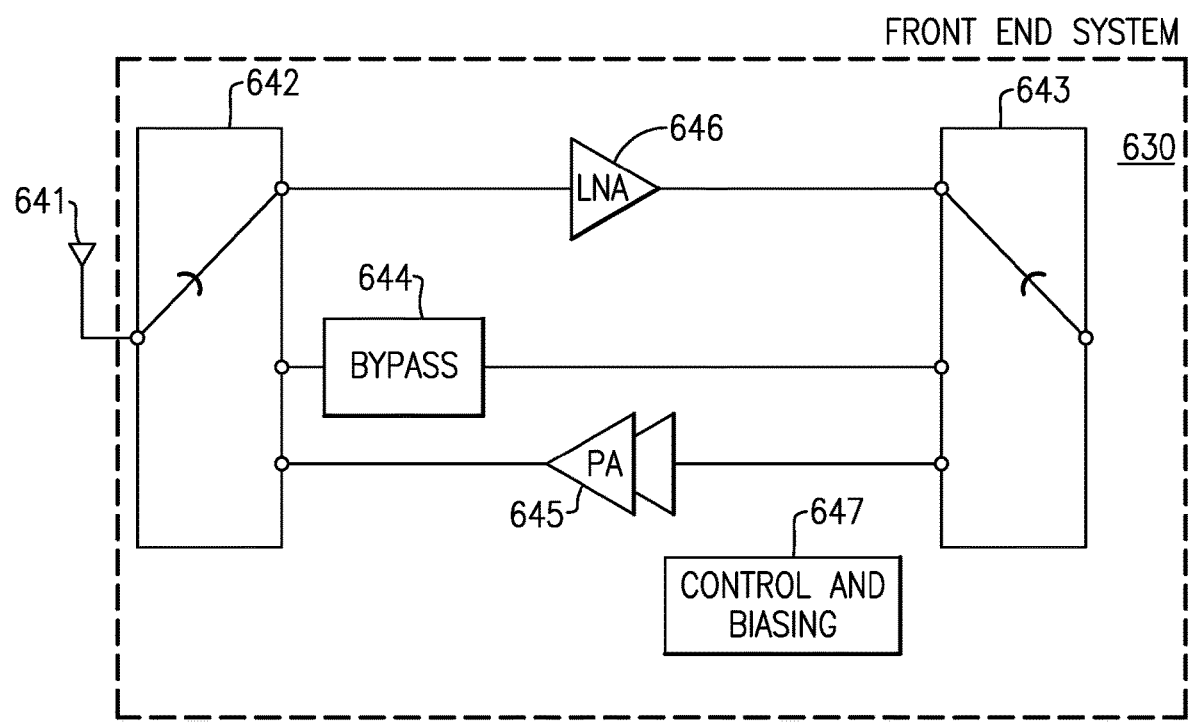
FIG. 7A is a schematic diagram of a front end system according to one embodiment.
Figure 7B:
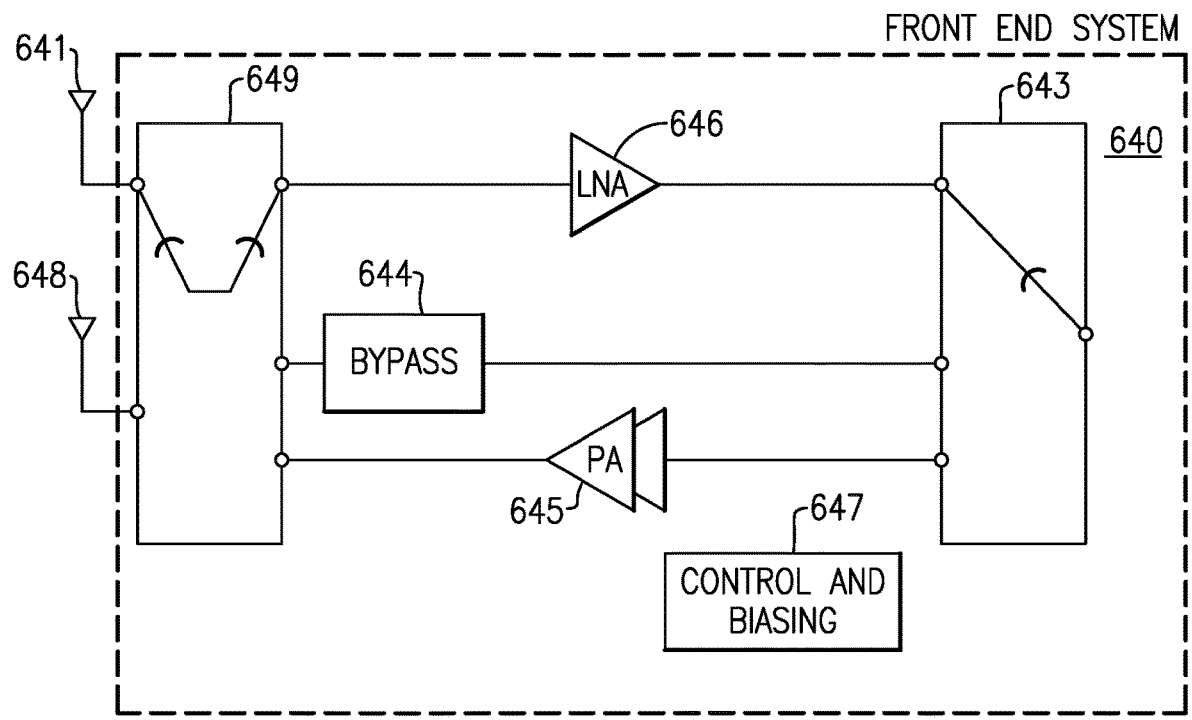
FIG. 7B is a schematic diagram of a front end system according to another embodiment.

FIG. 7A is a schematic diagram of a front end system 630 according to one embodiment. FIG. 7B is a schematic diagram of a front end system 640 according to another embodiment.

The front end systems of 7A and 7B can include EOS protection circuits implementing one or more features of the present disclosure. For example, the front end systems of 7A and 7B can include one or more semiconductor chips or ICs that include EOS protection circuits implemented in accordance with the teachings herein.

An RF front end system can include circuits in a signal path between an antennas and a baseband system. Some RF front ends can include circuits in signal paths between one or more antennas and a mixer configured to modulate a signal to RF or to demodulate an RF signal.

The front end systems of 7A and 7B can be implemented in a packaged module. Such packaged modules can include relatively low cost laminate based front end modules that combine power amplifiers with low noise amplifiers and/or switch functions. Some such packaged modules can be multi-chip modules. In certain implementations, some or the all of the illustrated components in any of the front end systems in FIGS. 7A and/or 7B can be embodied on a single integrated circuit or die. Such a die can be manufactured using any suitable process technology. As one example, the die can be a semiconductor-on-insulator die, such as a silicon-on-insulator (SOI) die. According to some implementations, one or more antennas can be integrated with any of the front end systems discussed herein.

With reference to FIG. 7A, the RF front end system 630 is configured to receive RF signals from an antenna 641 and to transmit RF signals by way of the antenna 641. The illustrated front end system 630 includes a first multi-throw switch 642, a second multi-throw switch 643, a receive signal path that includes an LNA 646, a bypass signal path that includes a bypass network 644, and a transmit signal path that includes a power amplifier 645. The low noise amplifier 646 can be implemented by any suitable low noise amplifier. The bypass network 644 can include any suitable network for matching and/or bypassing the receive signal path and the transmit signal path. The bypass network 644 can be implemented by a passive impedance network or by a conductive trace or wire.

The first multi-throw switch 642 can selectively connect a particular signal path to the antenna 641. The first multi-throw switch 642 can electrically connect the transmit signal path to the antenna 641 in a first state, electrically connect the receive signal path to the antenna 641 in a second state, and electrically connect the bypass signal path to the antenna 641 in a third state. The second multi-throw switch 643 can selectively connect a particular signal path to an input/output port of the front end system 630, in which the particular signal path is the same signal path electrically connected to the antenna 641 by way of the first multi-throw switch 642. Accordingly, the second multi-throw switch 643 together with the first multi-throw switch 642 can selectively connect a particular signal path between the antenna 641 and the input/output port of the front end system 630.

The control and biasing circuit 647 can be used to control and bias circuitry of the RF front end system 630. In certain configurations, the control and biasing circuit 647 receives a mode signal indicating a mode of operation of the power amplifier 645. The mode signal can be provided to the control and biasing circuit 647 in a variety of ways, such as over a serial interface. The control and biasing circuit 647 can use the mode signal for a variety of purposes, including, for example, controlling a voltage level of a supply voltage used to power an output stage of the power amplifier 645.

The RF front end system 640 of FIG. 7B is similar to the RF front end system 630 of FIG. 7A, except that the first multi-throw switch 649 is configured to selectively connect a particular signal path to either a first antenna 641 or a second antenna 648. The multi-throw switch 649 can be a multi-throw, multi-pole switch.

Applications

Some of the embodiments described above have provided examples in connection with communications devices, such as mobile phones and wireless devices. However, the principles and advantages of the embodiments can be used for any other systems or apparatus that have needs for EOS protection circuits.

For example, EOS protection circuits can be included in various electronic devices, including, but not limited to consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An integrated circuit with electrical overstress protection, the integrated circuit comprising:
a pad;
an internal circuit electrically connected to a signal node; and
an overstress protection circuit including an impedance element having a first end electrically connected to the pad and a second end electrically connected to the signal node, an overstress sensing circuit electrically connected between the first end of the impedance element and a first supply node, a controllable clamp electrically connected between the second end of the impedance element and the first supply node, a first reverse protection circuit electrically connected between the first end of the impedance element and the first supply node, a second reverse protection circuit electrically connected between the second end of the impedance element and the first supply node, and an overshoot limiting circuit electrically connected between the signal node and a second supply node, the overstress sensing circuit configured to activate the controllable clamp to conduct a current from the second end of the impedance element to the first supply node in response to detecting an electrical overstress event at the first end of the impedance element.

2. The integrated circuit of claim 1 wherein the overstress sensing circuit includes a plurality of diodes and a first field-effect transistor configured to activate when the electrical overstress event generates a flow of current through the plurality of diodes.

3. The integrated circuit of claim 2 wherein the controllable clamp includes a second field-effect transistor electrically connected with the first field-effect transistor as a current mirror.

4. The integrated circuit of claim 3 wherein the controllable clamp further includes a clamp diode electrically connected in series with the second field-effect transistor between the signal node and the first supply node.

5. The integrated circuit of claim 1 wherein the first supply node is a ground rail and the second supply node is a power supply rail.

6. The integrated circuit of claim 1 wherein the overshoot limiting circuit includes at least one diode configured to control a trigger voltage of the overshoot limiting circuit.

7. The integrated circuit of claim 6 wherein the overshoot limiting circuit includes two or more diodes electrically connected in series between the signal node and the second supply node.

8. The integrated circuit of claim 1 wherein the impedance element includes a resistor.

9. The integrated circuit of claim 1 further including a supply clamp electrically connected between the second supply node and the first supply node.

10. An overstress protection circuit for a semiconductor chip, the overstress protection circuit comprising:
an impedance element having a first end electrically connected to a pad and a second end electrically connected to a signal node;
a controllable clamp electrically connected between the second end of the impedance element and a first supply node;
an overstress sensing circuit electrically connected between the first end of the impedance element and the first supply node, the overstress sensing circuit configured to activate the controllable clamp to conduct a current from the second end of the impedance element to the first supply node in response to detecting an electrical overstress event at the first end of the impedance element;
an overshoot limiting circuit electrically connected between the signal node and a second supply node, the overstress protection circuit arranged so as to divert charge associated with the electrical overstress event away from the signal node to thereby provide overstress protection; and
a first reverse protection circuit electrically connected between the first end of the impedance element and the first supply node, and a second reverse protection circuit electrically connected between the second end of the impedance element and the first supply node.

11. The overstress protection circuit of claim 10 wherein the overstress sensing circuit includes a plurality of diodes and a first field-effect transistor configured to activate when the electrical overstress event generates a flow of current through the plurality of diodes.

12. The overstress protection circuit of claim 11 wherein the controllable clamp includes a second field-effect transistor having a gate voltage that is controlled based on a gate voltage of the first field-effect transistor.

13. The overstress protection circuit of claim 12 wherein the controllable clamp further includes a clamp diode electrically connected in series with the second field-effect transistor between the signal node and the first supply node.

14. The overstress protection circuit of claim 12 wherein the first and second field-effect transistors are electrically connected as a current mirror.

15. The overstress protection circuit of claim 10 wherein the first supply node is a ground rail and the second supply node is a power supply rail.

16. The overstress protection circuit of claim 10 wherein the overshoot limiting circuit includes at least one diode configured to control a trigger voltage of the overshoot limiting circuit.

17. The overstress protection circuit of claim 10 wherein the impedance element includes a resistor.

18. A method of providing overstress protection, the method comprising:
providing a voltage drop from a pad to a signal node in response to an electrical overstress event at the pad using an impedance element, the impedance element having a first end electrically connected to the pad and a second end electrically connected to the signal node;
detecting the electrical overstress event at the first end of the impedance element using an overstress sensing circuit connected between the first end of the impedance element and a first supply node;
activating a controllable clamp to conduct a current between the second end of the impedance element and the first supply node in response to detecting the electrical overstress event at the first end of the impedance element using the overstress sensing circuit;
protecting the signal node from overshoot before the controllable clamp is activated using an overshoot limiting circuit; and
protecting an internal circuit connected to the signal node using a first reverse protection circuit electrically connected between the first end of the impedance element and the first supply node, and a second reverse protection circuit electrically connected between the second end of the impedance element and the first supply node.

19. The method of 18 wherein activating the controllable clamp includes mirroring a current flowing through the overstress sensing circuit.

20. The method of 18 wherein protecting the signal node from overshoot includes forward biasing at least one diode.

* * * * *